(12) United States Patent
Faucett et al.

(10) Patent No.: US 8,922,991 B2
(45) Date of Patent: Dec. 30, 2014

(54) RUGGEDIZED COMPUTER ASSEMBLY HAVING INTERNAL FAN

(71) Applicant: Aplus Mobile Inc., Oregon City, OR (US)

(72) Inventors: Tim Faucett, Oregon City, OR (US); Scott Westfall, Oregon City, OR (US)

(73) Assignee: Aplus Mobile Inc., Oregon City, OR (US)

( * ) Notice: Subject to any disclaimer, the term of this patent is extended or adjusted under 35 U.S.C. 154(b) by 155 days.

(21) Appl. No.: 13/645,538

(22) Filed: Oct. 5, 2012

(65) Prior Publication Data

US 2013/0083475 A1    Apr. 4, 2013

Related U.S. Application Data

(63) Continuation of application No. 12/834,630, filed on Jul. 12, 2010, now Pat. No. 8,289,714, which is a continuation of application No. 12/319,259, filed on Jan. 5, 2009, now Pat. No. 7,773,375.

(60) Provisional application No. 61/019,207, filed on Jan. 4, 2008, provisional application No. 61/019,209, filed on Jan. 4, 2008.

(51) Int. Cl.

| | |
|---|---|
| *G06F 1/20* | (2006.01) |
| *H02J 7/14* | (2006.01) |
| *G06F 1/30* | (2006.01) |
| *H01L 23/367* | (2006.01) |
| *G06F 1/26* | (2006.01) |
| *H02J 7/34* | (2006.01) |
| *H05K 7/20* | (2006.01) |
| *H01L 23/467* | (2006.01) |

(52) U.S. Cl.
CPC ............... *G06F 1/263* (2013.01); *H02J 7/1438* (2013.01); *H01L 23/467* (2013.01); *G06F 1/305* (2013.01); *H01L 23/367* (2013.01); *H02J 7/34* (2013.01); *G06F 1/20* (2013.01)
USPC ............ 361/679.48; 361/679.46; 361/679.47; 361/690; 361/694; 361/695; 361/697; 165/80.2; 165/80.3; 165/104.33; 165/122; 454/184

(58) Field of Classification Search
USPC ........................ 361/679.46–679.54, 688, 689, 361/690–697, 704–719, 816, 818, 831; 165/80.2–80.5, 104.33, 122–126, 185; 174/50.52, 17 VA, 386, 387; 312/223.2; 454/184
See application file for complete search history.

(56) References Cited

U.S. PATENT DOCUMENTS

| | | | | |
|---|---|---|---|---|
| 4,259,843 A | * | 4/1981 | Kausch | ............................ 62/3.1 |
| 5,748,269 A | * | 5/1998 | Harris et al. | ................... 349/58 |

(Continued)

FOREIGN PATENT DOCUMENTS

| | | | | |
|---|---|---|---|---|
| DE | 29723144 U1 | * | 4/1998 | ............... G06F 1/20 |
| EP | 1093049 A2 | * | 4/2001 | ............... G06F 1/20 |

*Primary Examiner* — Michail V Datskovskiy
(74) *Attorney, Agent, or Firm* — Timothy E. Siegel Patent Law, PLLC; Timothy E. Siegel (57) ABSTRACT

A computer assembly includes a processor integrated circuit; a hard disk drive electrically connected to the processor integrated circuit and a power supply assembly, powering the processor integrated circuit and hard disk drive; a liquid-tight case, entirely containing and physically isolating and protecting the processor integrated circuit, hard disk drive and power supply assembly, the liquid-tight case defining fluid channels; electrical connectors to permit connection of the computer to outside devices; and a fan in the liquid-tight case, adapted to drive fluid through the fluid channel, thereby facilitating the movement of heat through the computer assembly.

8 Claims, 6 Drawing Sheets

(56) References Cited

U.S. PATENT DOCUMENTS

| | | | |
|---|---|---|---|
| 5,773,755 A * | 6/1998 | Iwatare | 174/17 VA |
| 5,991,153 A * | 11/1999 | Heady et al. | 361/704 |
| 6,101,090 A * | 8/2000 | Gates | 361/690 |
| 6,392,704 B1 * | 5/2002 | Garcia-Ortiz | 348/373 |
| 6,493,440 B2 * | 12/2002 | Gromatzky et al. | 379/161 |
| 6,504,713 B1 * | 1/2003 | Pandolfi et al. | 361/695 |
| 6,529,374 B2 * | 3/2003 | Yamashita et al. | 361/679.33 |
| 6,532,152 B1 * | 3/2003 | White et al. | 361/692 |
| 6,721,651 B1 * | 4/2004 | Minelli | 701/538 |
| 7,209,353 B2 * | 4/2007 | Ammirata | 361/695 |
| 7,817,420 B2 * | 10/2010 | Drummy et al. | 361/695 |
| 7,916,487 B2 * | 3/2011 | Bitton et al. | 361/724 |
| 2002/0154255 A1 * | 10/2002 | Gromatzky et al. | 349/60 |
| 2003/0007325 A1 * | 1/2003 | Thunem et al. | 361/687 |
| 2007/0061598 A1 * | 3/2007 | Bitton et al. | 713/194 |

* cited by examiner

RUGGEDIZED COMPUTER ASSEMBLY HAVING INTERNAL FAN

RELATED APPLICATIONS

This application is a continuation of application Ser. No. 12/834,630 filed Jul. 12, 2010, now U.S. Pat. No. 8,289,714, which in turn is a continuation of non-provisional application Ser. No. 12/319,259, filed Jan. 5, 2009, now U.S. Pat. No. 7,773,375, which in turn claims priority from provisional applications 61/019,207 and 61/019,209, both filed Jan. 4, 2008 and all hereby incorporated by reference as if fully set forth herein.

TECHNICAL FIELD

The present disclosure is related to a ruggedized electrical device, able to operate reliably from a power bus that suffers intermittent voltage reductions and aspects thereof. More specifically, the electrical device may be a computer.

BACKGROUND

In vehicles and devices there is an increasing need for a rugged computer assembly that is isolated from the elements and that can function with high reliability even though powered by a bus that is intermittently unable to meet the full power demand placed upon it.

SUMMARY

In a first separate aspect, the present invention may take the form of a computer assembly that includes a processor integrated circuit; a hard disk drive electrically connected to the processor integrated circuit and a power supply assembly, powering the processor integrated circuit and hard disk drive; a liquid-tight case, entirely containing and physically isolating and protecting the processor integrated circuit, hard disk drive and power supply assembly, the liquid-tight case defining fluid channels; electrical connectors to permit connection of the computer to outside devices; and a fan in the liquid-tight case, adapted to drive fluid through the fluid channel, thereby facilitating the movement of heat through the computer assembly.

In a second separate aspect, the present invention may take the form of a computer assembly, that includes an electrical assembly adapted for uninterruptible operation and including a delicate heat-producing integrated circuit; a hard disk drive electrically connected to the electrical assembly; a power supply assembly, powering the electrical assembly and hard disk drive; a liquid-tight case, entirely containing and physically isolating and protecting the electrical assembly, hard disk drive and power supply assembly, the liquid-tight case defining fluid channels; electrical connectors to permit connection of the computer to outside devices; and a fan in the liquid-tight case, adapted to drive fluid through the fluid channel, thereby facilitating the movement of heat through the computer assembly.

The embodiments described below generally address the need for a ruggedized computer that can be deployed in a physical environment where it receives physical impacts and where it may have gases, liquids and solid/liquid mixtures (eg. mud) contacting its outside surfaces. Also, available electrical power may be subject to intermittent failure. Many issues arise in the design of this type of device, and many of the solutions to these issues may find application in other fields.

DETAILED DESCRIPTION

Several aspects of the present disclosure are directed to aspects of a rugged computer assembly that can function with high reliability even when supplied by a bus that intermittently fails to meet power demand. Skilled persons will understand that additional embodiments may be practiced without several of the details described below, and that other embodiments may include aspects in addition to those described below.

Figure 1:
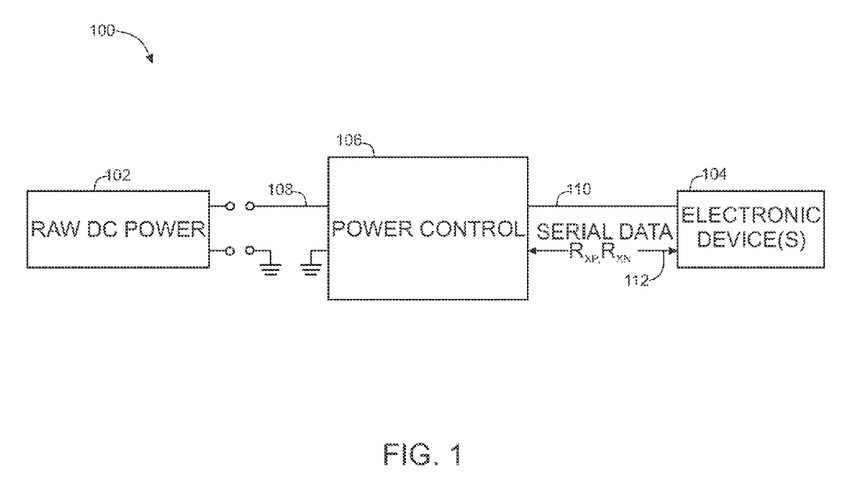
FIG. 1 is schematic diagram of a mobile power system employing a power supply unit configured in accordance with an embodiment of the disclosure.

FIG. 1 is a schematic diagram of a mobile power system 100 including a DC power source 102, one or more electronic devices 104, and a power supply unit 106 that can operably couple the power source 102 with the electronic devices 104 via input and output power busses 108 and 110. In several embodiments, the power supply unit 106 can also exchange serial data with the electronic devices 104 via a serial link 112 (described further with reference to FIG. 4). In general, the power source 102 provides raw DC power, and can include a variety of elements, such as a battery, an alternator, and/or any one of various types of AC-to-DC converters. In many embodiments, the electronic devices 104 include any of a myriad of consumer electronic devices that are configured to receive DC power (e.g., a personal computer, a mobile phone, a GPS unit, etc.).

In other embodiments, the electronic devices 104 can be incorporated and/or integrated with the power supply unit 106. Such a combination can be deployed as a single unit, for example, as a computing device that can be energized by the (raw) DC power source on input bus 108 without any intervening components. In addition, embodiments of this type of device can be deployed in a single rugged and protective housing, as described further below with reference to FIGS. 5 and 6.

Figure 2:
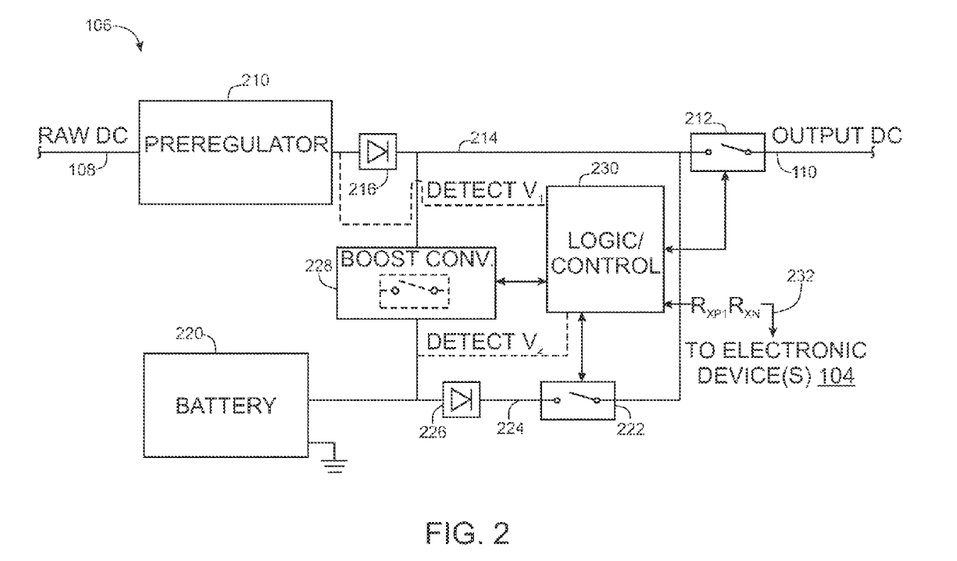
FIG. 2 is a schematic diagram illustrating the power supply unit of FIG. 1 in more detail.

FIG. 2 is a schematic diagram illustrating the power supply unit 106 in more detail. In the example shown in FIG. 2, the power supply unit 106 includes a preregulator 210 coupled to the input bus 108. For example, in an automobile electronic system, the voltage at the input bus 108 can be in a range of about −50 to +60V, and the preregulator 210 can step down this voltage to a range of about +8 to +22V. In several embodiments the preregulator 210 includes an automotive grade switching regulator to achieve this task. A preregulator output diode 216, couples the output of preregulator 210 to a first internal bus 214. In turn, a main switch 212 couples (and de-couples) bus 214 to output bus 110. The power supply unit 106 also includes a battery 220 (e.g., a sealed lead acid, NiMH, LiPo battery, or UPS battery system of sufficient current capability for the application), the positive terminal of which being connected to an output diode 226 terminal. The other terminal of diode 226 is connected to a second internal power bus 224. A boost converter 228 is electrically interposed between the first and second buses 214 and 224. For example, the boost converter 228 can output a regulated voltage in a range of about 13-14V, which can trickle charge a 12 V battery 220, or a range of 25 to 27V for charging a 24 V battery. A battery switch 222 couples first bus 214 to second bus 224. In a representative embodiment, the power supply unit 106 includes a logic/control assembly 230 that controls the main switch 212, the battery switch 222, and the boost converter 228. In addition, the logic/control assembly 230 can also exchange serial communications 232 with the electronic devices 104. For example, the serial communications 232 can indicate events such as whether the battery 220 is recharging or whether the battery 220 is supplying power to the electric devices 104. Communications 232 can also provide a way to change other programmable power supply 106 features during operation such as program timing changes and trigger points and can even replace the entire program for the logic control assembly 230 with a newer version (described further with reference to FIG. 4).

The logic control/control assembly 230 generally operates the power supply unit 106 in one of at least two states of operation. In a first state of operation and/or when the preregulator output voltage V1 is at or above a predetermined trigger point, the boost converter 228 charges battery 220 with a boosted voltage V2 and maintains battery switch 222 in an open state so that first internal bus 214 is powered by preregulator 210, rather than battery 220. In a second state of operation commanded when the preregulator output voltage V1 is below the trigger point, the logic/control assembly 230 de-activates the boost converter 228 and couples the second bus 224 with the first bus 214 via the battery switch 222, thereby powering devices 104 from the battery 220.

Figure 3:
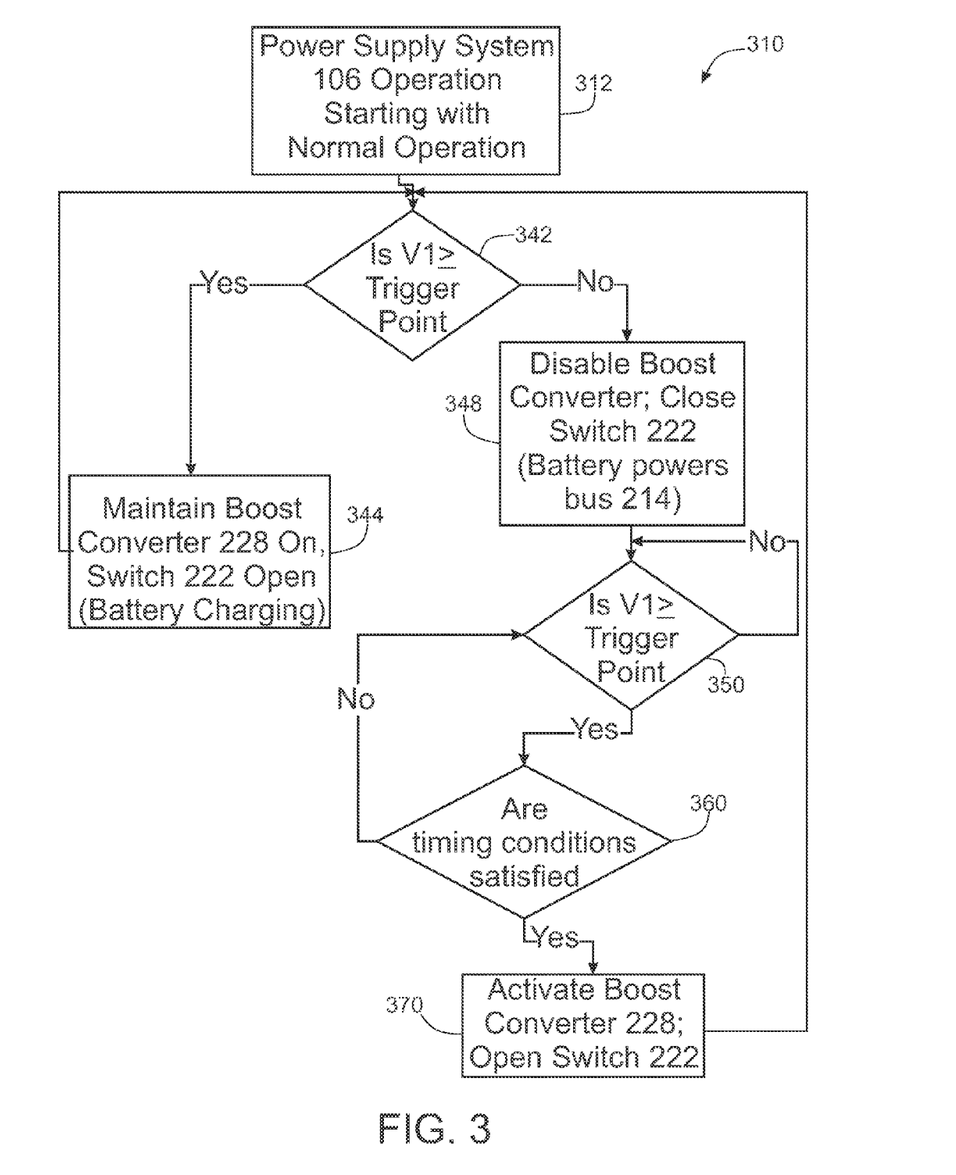
FIG. 3 is a flow diagram showing operation of the power supply unit in accordance with an embodiment of the disclosure.

FIG. 3 is a flow diagram showing an embodiment of a method of operating the power supply unit 106. The flow chart begins with unit 106 in the first operational state, its most typical condition, receiving above-trigger point voltage on bus 108 and with boost converter 228 activated and switch 222 closed. In the next instant, the logic control assembly 230 detects whether the preregulator output voltage V1 is still above the trigger point (decision box 342), indicating an adequate voltage V1. If it is, nothing is changed (block 344). If the first bus voltage V1 is less than the predetermined trigger point, the second operational state is commanded. Boost converter 228 is disabled and the battery switch 222 is closed (block 348). In this second state, the battery 220 drives the first bus 214, thereby powering devices 104. From this state, V1 is tested against the trigger point (decision box 350). The diode 216 permits a higher voltage to exist on bus 214 than at the output of preregulator 210. This is essential for sensing the restoration of preregulator output voltage after a voltage low condition (decision box 350). When V1 again rises above the trigger point, it is determined if time conditions have been met (decision box 360) to switch back to the first state (block 370), in which converter 228 is activated and 222 is closed.

The time conditions of decision box 360 are designed to prevent a rapid toggling between states. If, for example, V1 has been lowered due to a current demand from another device, the removal of the load of power supply 106 may be enough to cause the V1 to recover in, for example, a millisecond. If there were no timing conditions, this would cause converter 228 to be immediately reactivated, causing V1 to go low again in, for example, a millisecond. In this manner unit 106 could oscillate between states at a 0.5 mHz rate, which would be harmful to system operation. In one preferred embodiment a one second timeout is implemented from the time converter 228 is deactivated, to the time when it may be reactivated. Typically battery 220 stores enough charge so that the timeout period could be made quite a bit longer than one second, without threatening to drain battery 220. In a preferred embodiment, timing conditions are set to match the characteristics of the overall system. In many embodiments the timeout function is performed by a hysteresis circuit associated to the boost converter 226. In other preferred embodiments, the timeout function is performed by the logic/control assembly 230.

Figure 4:
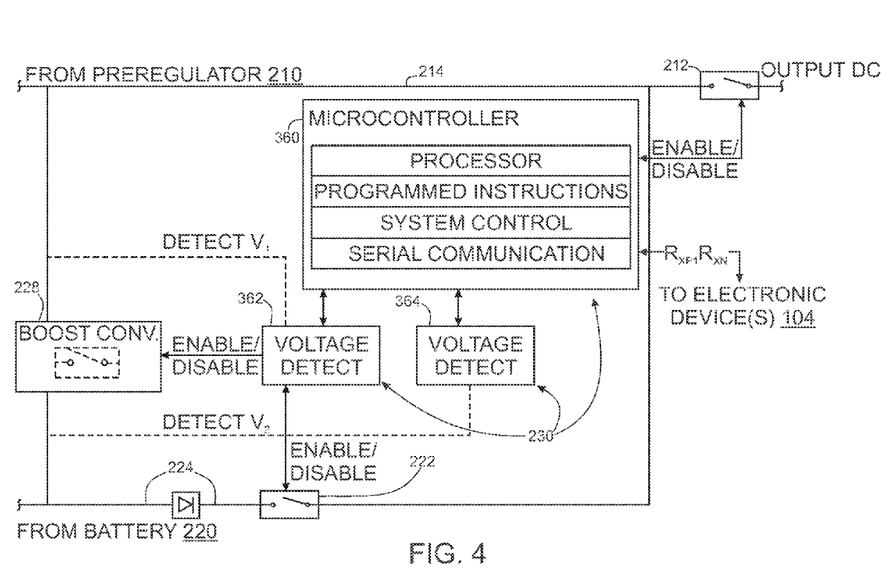
FIG. 4 is a schematic diagram of the power supply assembly in accordance with an embodiment of the disclosure.

FIG. 4 is a schematic diagram of components of the power supply unit 106, including the first and second busses 214 and 224, the boost converter 228, the switches 212 and 222, and individual logic/control components 230. More specifically, the logic control components 230 include a microcontroller 360 and voltage detect components 362 and 364 hardware wired to the enables of the boost converter 228 and the battery switch 222, respectively (in many embodiments, the boost converter 228 and the battery switch 222 can also be coupled to the microcontroller 360). In general, the microcontroller 360 includes a processor, associated program instructions, and system control and serial communication components. The voltage detect component 362 can measure whether the first bus voltage V1 is at or above the trigger point voltage, and the microcontroller 360 can enable the battery switch 222 and the boost converter 228 based on the detected first bus voltage V1. The voltage detect component 364, on the other hand, can measure the voltage level of the second bus 224 and/or the battery 220. For example, the microcontroller 360 can use the voltage detect component 364 to determine whether the battery 220 is operational and/or to determine charge level at the battery 220.

In many embodiments, the microcontroller 360 can also enable the main switch 212 depending on the state of the first and/or second busses 214 and 224. If the electronic device 104 is a PC motherboard, for example, the microcontroller 360 can be configured to disable the standby or sleep voltage demand of the power supplied to the motherboard by disabling the main switch 212 only after the motherboard has communicated to the microcontroller 360 that it is completely shut down. In such an example, the motherboard may have one of two interactive logic level bits attached to the front panel header. One bit is an LED output for "CPU-on" and the other is a front panel switch input bit.

The microcontroller 360 can be configured to sense the voltage at the first bus 214, interpret this as a "computer-on" command and activate the motherboard. To do this, the microcontroller 360 can pulse an off/on switch bit on the motherboard and also verify at the "CPU-on" output that the motherboard has booted. For example, whenever the input bus 108 (or first bus 214) is powered, the microcontroller 360 can be configured to verify that the motherboard is running or needs to be booted. When the input bus 108 (or first bus 214) has been down for a predetermined amount of time, the microcontroller 360 can interpret this is a command to "turn off" the motherboard and do so by pulsing the on/off front panel bit on the motherboard and request a shutdown from a (power aware) operating system. Battery 220 provides power during an orderly motherboard "turn off" sequence. One aspect of such a configuration of the microcontroller 360 is that many or all of processes carried out by the power supply unit 106 use no (or limited) software drivers, and system control can accordingly be carried out exclusively in hardware, based on the state of power at the input bus 108 and the operating state of the motherboard. This eliminates the need for a third wire, needed to indicate the beginning of a "turn off" sequence, that complicates prior art designs.

The above described system addresses numerous deficiencies in previously available power supply systems. For example, conventional power supplies use a boost converter-regulated front-end to maintain a tightly regulated intermediate bus voltage during DC power deviation or "sag" at the main bus. Such a topology demands proportionally increased current from the main bus in order to offset voltage sag. This creates a conflict condition when another device on the main bus is demanding high current, resulting in neither device being able to draw enough current to maintain its required internal voltage. Also, although the typical boost converter includes storage capacitors to provide power during power interrupts, these capacitors are quickly drained, again resulting in an insufficient intermediate bus voltage. Additionally, although existing uninterruptible power supply (UPS) systems include a battery, the battery is typically in-line-float-charged from the boost converter. Such an arrangement causes the battery to always be in-circuit and prevents the battery from being charged at the optimum charge voltage level. This compromises the life of a conventional battery system and the ability to meet current demand. Furthermore, conventional (controllable) DC based power supplies use fixed timers to control the shutdown and/or reboot sequences and times and are not interactive with external devices or components of an external device (e.g., a motherboard). In general, these supplies require a 'three wire' connection with a user switch for shutdown activation, and they have no user communication ports for real-time parameter changes or to control sequences of operation.

Embodiments of the power supply unit 106, however, mitigate these and other issues associated with conventional power supplies and converters. For example, the boost converter 228 is disabled when the main bus voltage drops below a programmable trigger point, reducing current demand from the pre-regulator 210 and thereby avoiding competition with other devices for main bus current. During these periods switch 222 is closed, permitting battery 220 to maintain proper voltage on intermediate bus 214 for far longer than do the converter storage capacitors in existing systems. Battery 220 is either supplying power or being charged at an ideal charging voltage. This preserves battery life and maximized the probability that when the battery is called upon to supply power it will be able to do so adequately.

Figure 5:
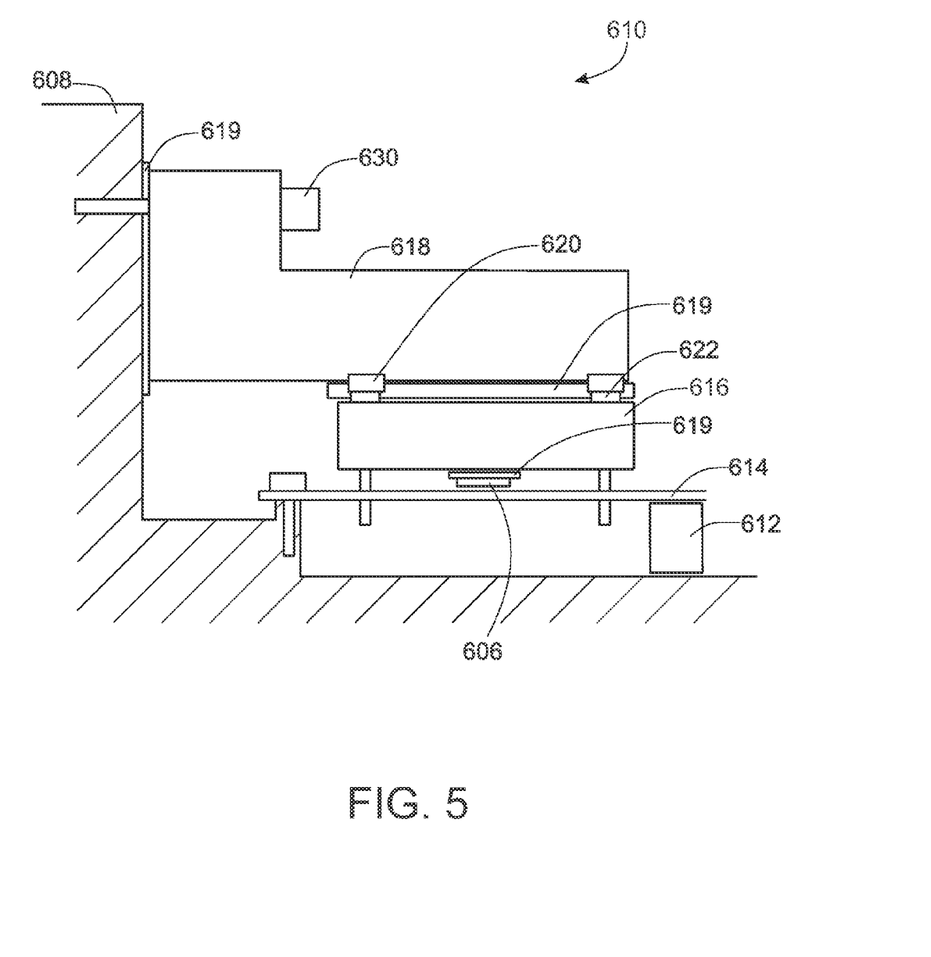
FIG. 5 is a side cross-sectional view of an integrated circuit and a thermal assembly designed to absorb heat therefrom.
Figure 6:
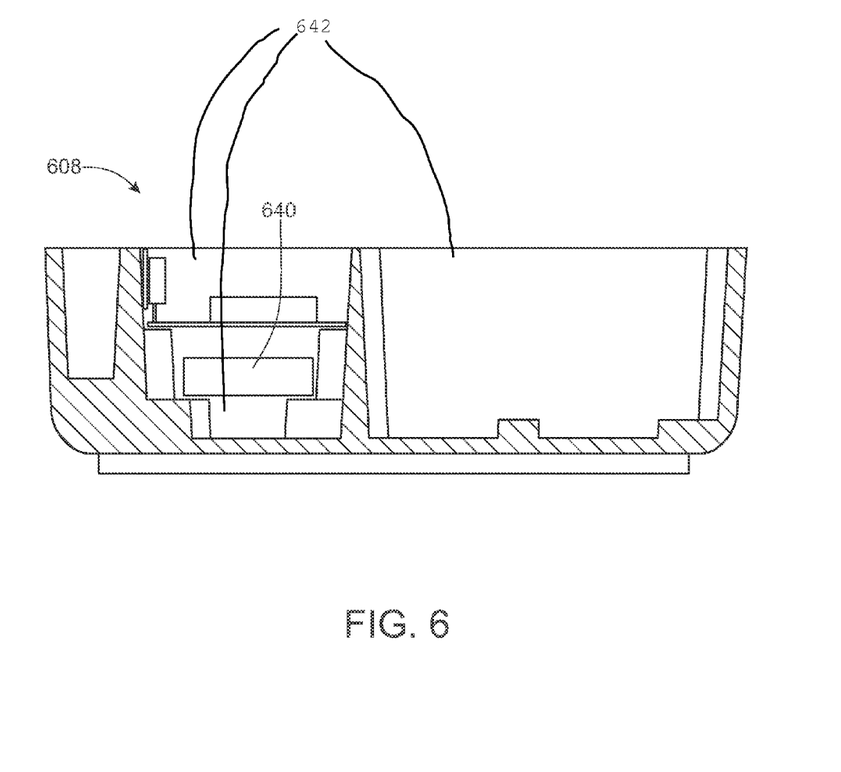
FIG. 6 is a cross-section plan view of a liquid-tight computer case and fan, according to the present invention.

Referring to FIGS. 5 and 6, the electrical network described above finds application in a rugged computer system. In a preferred embodiment, this system includes a processor integrated circuit (IC) 606 and two hard disk drives sealed within a metal case 608 (FIG. 6). One challenge in providing a system of this type is cooling and providing thermal stability for the electrical components without a capability of blowing air in from the outside. To meet the need of cooling the processor IC 606, a thermal assembly 610 is provided. This system includes the IC 606, which is electrically and physically connected to a printed circuit board (PCB) substrate 614 by a set of solder balls (not shown). A slide plate 616 is positioned above and placed in thermal contact with the IC 606. In turn, a thermal mass 618 is positioned above and placed in thermal contact with the slide plate 616. Finally, the thermal mass 618 is in thermal contact with the case 608. Thermal grease 619 is interposed between and permits thermal flow between the four components 606, 616, 618 and 608. Accordingly, the heat produced by IC 606 flows to slide plate 616, from whence it flows to thermal mass 618, and then to case 608. Thermal mass 618 also acts as a heat reservoir, changing only slowly and preventing an overly rapid change in the temperature of IC 606. The whole assembly 610 must maintain a tension to resist shock and vibration so elastomeric bumpers 612 are used to help constrain the PCB substrate 614 and to dampen vibration.

A great challenge in the design of thermal assembly is avoiding physical damage to the system, in particular to the solder balls connecting IC 606 to PCB substrate 614. If permitted, in the environment of physical shocks in which the rugged computer is designed to be deployed, the physical mass of thermal mass 618 could easily impact slide plate 616 into IC 606, thereby crushing the solder balls or cracking IC 606. Also the heating and cooling of the product over its lifetime will expand and contract the internal parts at different rates creating shear conditions on the connections to the IC 606. To prevent damage to the solder balls, slide plate 616 is mounted from pins 620 mounted in PCB substrate 614 and is suspended from pins 620 by tension springs 622. Accordingly, slide plate 616 can ride up and down with IC 606 and shift in coplanar dimension relative to the contact surfaces of IC 606, thereby avoiding stress to the solder balls and to IC 606.

Thermal mass 618 is fastened to the case 608 by stud 630. This connection suspends mass 618 over slide plate 616, to control the pressure of mass 618 on slide plate 616. As noted, thermal contact is maintained between mass 618 and slide plate 616 by thermal grease 619, which permits relative movement between the two components.

Referring specifically to FIG. 6, the above described assembly is housed in case 608 (bottom half shown), which has an internal fan 640 to blow air through a series of plenums 642, thereby distributing heat throughout the system, and stabilizing any heat contributions not already mechanically connected to the thermal structure. In a preferred embodiment, IC 606 produces 35 Watts of heat at full operation and assembly 610 (including case 608) takes 7 hours for its temperature to be elevated from a starting temperature of 15° C. to 50° C. The temperature of assembly 610 thereafter remains at a stable 50° C. in ambient air temperatures of up to 30° C. Moreover, a preferred embodiment includes a chip set that supports IC 606 and that also requires a thermal stack, similar to assembly 610 to remove heat and lessen thermal cycling while avoiding physical damage. In this embodiment slide plate 616 and thermal mass 618 are made of 2024 aluminum alloy, case 608 is of cast aluminum. Slide plate 616 has a mass of 40.8 grams for the CPU assembly 610 and 49.9 grams for the parallel assembly for the chip set. Also, thermal mass 618 has a mass of 99.8 grams for the CPU assembly 610 and 136.1 grams for the parallel assembly for the chip set. Finally, case 606 has a mass of 2536 grams and a surface area of 1332.4 cm$^2$.

From the foregoing, it will be appreciated that representative embodiments have been described herein for purposes of illustration, but that various modifications may be made to these embodiments, including adding and/or eliminating particular features. For example, in some embodiments the main switch 212 can be omitted. Also, in other embodiments, the logic/control components 230 may include other components and/or configurations. For example, one or more of the voltage detect circuits 362 and 364 can be functionally programmed into the microcontroller 360 (see also Appendix C). In addition, while representative examples of the system were described above in the context of DC power, other embodiments may include other types of power, such as DC-pulsed power or AC power. Further, while advantages associated with certain embodiments have been described in the context of those embodiments, other embodiments may also exhibit such advantages, and not all embodiments need necessarily exhibit such advantages to fall within the scope of the invention. The following examples and appendices provide further representative embodiments.

The invention claimed is:

1. A computer assembly, comprising:
   a) a processor integrated circuit;
   b) non-volatile data storage device electrically connected to said processor integrated circuit;
   c) a power supply assembly, powering said processor integrated circuit and non-volatile data storage device;
   d) a liquid-tight case, entirely containing and physically isolating and protecting said processor integrated circuit, non-volatile data storage device and power supply assembly, said liquid-tight case defining plenums;
   e) electrical connectors to permit connection of said computer to outside devices; and
   f) a fan in said liquid-tight case, adapted to drive fluid through said plenum, thereby facilitating the movement of heat through said computer assembly.

2. The assembly of claim 1, wherein said processor integrated circuit is in physical contact to a thermal assembly adapted to provide heat flow away from said processor integrated circuit.

3. The assembly of claim 2, wherein said thermal assembly is configured so as to avoid physical damage to said processor integrated circuit by being mounted so as to permit portions of said thermal assembly to move with said processor integrated circuit.

4. The assembly of claim 1, wherein said case is generally air-filled and wherein said plenums are air channels and said fan is adapted to drive air through said air channels.

5. A computer assembly, comprising:
   a) an electrical assembly adapted for uninterruptible operation and including a delicate heat-producing integrated circuit;
   b) a non-volatile data storage device electrically connected to said electrical assembly;
   c) a power supply assembly, powering said electrical assembly and non-volatile data storage device;
   d) a liquid-tight case, entirely containing and physically isolating and protecting said electrical assembly, non-volatile data storage device and power supply assembly, said liquid-tight case defining plenums;
   e) electrical connectors to permit connection of said computer to outside devices; and
   f) a fan in said liquid-tight case, adapted to drive fluid through said plenum, thereby facilitating the movement of heat through said computer assembly.

6. The assembly of claim 5, wherein said integrated circuit is in physical contact to a thermal assembly adapted to provide heat flow away from said integrated circuit.

7. The assembly of claim 6, wherein said thermal assembly is configured so as to avoid physical damage to said processor integrated circuit by being mounted so as to permit portions of said thermal assembly to move with said integrated circuit.

8. The assembly of claim 5, wherein said case is generally air-filled and wherein said plenums are air channels and said fan is adapted to drive air through said air channels.

* * * * *

UNITED STATES PATENT AND TRADEMARK OFFICE
CERTIFICATE OF CORRECTION

PATENT NO. : 8,922,991 B2  
APPLICATION NO. : 13/645538  
DATED : December 30, 2014  
INVENTOR(S) : Tim Faucett and Scott Westfall

Page 1 of 1

It is certified that error appears in the above-identified patent and that said Letters Patent is hereby corrected as shown below:

In the Claims

In Column 7, Line 9 in Claim 1b, after "b" and before "non-volatile" insert --a--.

Signed and Sealed this  
Fifth Day of April, 2016

Michelle K. Lee  
*Director of the United States Patent and Trademark Office*